(12) United States Patent
Saito et al.

(10) Patent No.: US 7,209,376 B2
(45) Date of Patent: Apr. 24, 2007

(54) STACKED SEMICONDUCTOR MEMORY DEVICE

(75) Inventors: Hideaki Saito, Tokyo (JP); Yasuhiko Hagihara, Tokyo (JP); Muneo Fukaishi, Tokyo (JP); Masayuki Mizuno, Tokyo (JP); Hiroaki Ikeda, Tokyo (JP); Kayoko Shibata, Tokyo (JP)

(73) Assignees: NEC Corporation, Tokyo (JP); Elpida Memory, Inc., Tokyo (JP)

( * ) Notice: Subject to any disclaimer, the term of this patent is extended or adjusted under 35 U.S.C. 154(b) by 137 days.

(21) Appl. No.: 11/151,213

(22) Filed: Jun. 14, 2005

(65) Prior Publication Data

US 2005/0286334 A1 Dec. 29, 2005

(30) Foreign Application Priority Data

Jun. 29, 2004 (JP) ............................. 2004-191410

(51) Int. Cl.
*G11C 5/06* (2006.01)
(52) U.S. Cl. ..................... 365/63; 365/51; 365/130; 365/231; 711/117; 257/759
(58) Field of Classification Search ................. 365/63, 365/51, 130, 185.05; 364/231; 711/117; 257/759
See application file for complete search history.

(56) References Cited

U.S. PATENT DOCUMENTS 5,744,827 A * 4/1998 Jeong et al. ................. 257/686
5,831,924 A * 11/1998 Nitta et al. .............. 365/230.03
6,567,290 B2 * 5/2003 Alexanian ...................... 365/63
2003/0067082 A1 * 4/2003 Moshayedi .................. 257/777

FOREIGN PATENT DOCUMENTS

| JP | 04-196263 | 7/1992 |
| JP | 2001-273764 | 10/2001 |
| JP | 2002-026283 | 1/2002 |
| JP | 2003-204030 | 7/2003 |
| JP | 2004-158892 | 6/2004 |

OTHER PUBLICATIONS

Kenji Takahashi, et al.; "Current Status of Research and Development for Three-Dimensional Chip Stack Technology"; Jpn. J. Appl. Phys.; vol. 40; 2001; pp. 3032-3037.

* cited by examiner

*Primary Examiner*—Richard T. Elms
*Assistant Examiner*—Toan Le
(74) *Attorney, Agent, or Firm*—Dickstein Shapiro LLP

(57) ABSTRACT

A three-dimensional semiconductor memory device having the object of decreasing the interconnection capacitance that necessitates electrical charge and discharge during data transfer and thus decreasing power consumption is provided with: a plurality of memory cell array chips, in which sub-banks that are the divisions of bank memory are organized and arranged to correspond to input/output bits, are stacked on a first semiconductor chip; and interchip interconnections for connecting the memory cell arrays such that corresponding input/output bits of the sub-banks are the same, these interchip interconnections being provided in a number corresponding to the number of input/output bits and passing through the memory cell array chips in the direction of stacking.

14 Claims, 8 Drawing Sheets

Fig.5

|  | 4bit | 8bit | 16bit | 32bit | 64bit | 128bit |
|---|---|---|---|---|---|---|
| 4bank | 16 | 32 | 64 | 128 | 256 | 512 |
|  | 32Mb | 16Mb | 8Mb | 4Mb | 2Mb | 1Mb |
| 8bank | 32 | 64 | 128 | 256 | 512 | 1024 |
|  | 16Mb | 8Mb | 4Mb | 2Mb | 1Mb | 500Kb |
| 16bank | 64 | 128 | 256 | 512 | 1024 | 2048 |
|  | 8Mb | 4Mb | 2Mb | 1Mb | 500Kb | 250Kb | ced up to a number n of banks 20.

STACKED SEMICONDUCTOR MEMORY DEVICE

BACKGROUND OF THE INVENTION

1. Field of the Invention

The present invention relates to a semiconductor integrated circuit device, and more particularly to a semiconductor memory device in which a plurality of semiconductor chips that include a memory cell array chip are stacked.

2. Description of the Related Art

The miniaturization of semiconductor integrated circuits has raised the degree of integration and has thus advanced the development of higher capacities in DRAM (Dynamic Random Access Memory) and SRAM (Static Random Access Memory). However, because there are limits to the miniaturization of semiconductors, new technologies are being sought to achieve further increases in the degree of integration.

Three-dimensional semiconductors, in which semiconductor chips are stacked, have been proposed as one technology for raising the degree of integration of memory. Japanese Patent Laid-Open Publication No. H04-196263 describes a means for realizing a large-scale integrated circuit without changing the chip area by stacking semiconductor chips and discloses the integration of memory circuits on a separate chip that is stacked on the main body of a semiconductor integrated circuit. In addition, Japanese Patent Laid-Open Publication No. 2002-026283 describes a multilayer memory configuration in which memory cell arrays are multilayered to obtain greater capacity.

Multilayering of semiconductor chips necessitates interconnections between semiconductor chips in addition to the previously required interconnections within the semiconductor chip area. As the interconnections between semiconductor chips, vias that pass through semiconductor chips have been proposed as a means of increasing interconnection density. In K. Takahashi et al. in the Japanese Journal of Applied Physics, 40, 3032 (2001), a technology is disclosed in which a silicon chip was thinned to 50 µm, square holes measuring 10 µm on each side were opened in the silicon chip, and these holes were then filled with a metal to form vias for use in interconnections between semiconductor chips. The interconnections between semiconductor chips that are realized by these vias can be arranged two-dimensionally within the surface of a semiconductor chip, and thus allow several hundred interchip interconnections.

In-plane interconnections can be long because the dimension of one edge of a semiconductor chip may be greater than 10 mm, while the length of semiconductor interchip interconnections can be extremely short because the thickness of a semiconductor chip is on the order of just 50 µm. Accordingly, when transferring data between a plurality of stacked semiconductor chips, the use of a multiplicity of interconnections between semiconductor chips that are arranged two-dimensionally within the area of the semiconductor chips, as with vias, allows a reduction of the total interconnection length of the three-dimensional interconnections.

FIG. 1 is a plan view showing the interconnections of a memory cell array in which a plurality of memory cell arrays are arranged in a plane without using interconnections between chips, and FIG. 2 is a plan view showing a memory cell array chip having a number n of banks 20.

As shown in FIG. 1, a memory cell array chip of the prior art is provided with a plurality of memory cell arrays 10 that are configured as banks for the purpose of interleaving memory access operations. Each memory cell array 10 is provided with row decoder 12 and column decoder 13 for carrying out read and write operations. In addition, each memory cell array 10 has DQ11 (which are data lines for input/output of one bit, these being paired lines in some cases) for all input/output bits (DQ0, DQ1, DQ2, and DQ3), and when one interchip interconnection is used for each bit for transferring data between chips, a plurality of interconnections of a length on the order of the chip size is necessary within the chip area for collecting the DQ lines for each bit from all banks that are arranged over the entire chip area.

As shown in FIG. 2, each bank has memory regions for all input/output bits, and in-plane interconnections are therefore required for DQ lines that connect the banks that are distributed over the entire area of the chip surface.

This in-plane interconnection is further necessary for the number of stacked memory cell array chips. In contrast, when interchip interconnections are provided for input/output bits in each and every memory cell array 10, the need for long interconnections between in-plane banks can be eliminated, and increase in the three-dimensional interconnection length can therefore be suppressed despite increase in the number of stacked chips.

As explained in the foregoing explanation, the application of interchip interconnections to a semiconductor memory device, in which semiconductor chips are stacked, is effective for suppressing an increase in the interconnection length. Nevertheless, vias that are used in three-dimensional interchip interconnections have a problem of greater capacitance than ordinary in-plane interconnections. Compared to in-plane chip interconnections, which have a thickness of just 1 µm or less, vias must have a thickness of 10 µm or more due to processing restrictions, and further, these vias are enclosed by the silicon substrate chip and further have a long perimeter, whereby vias exhibit considerable parasitic capacitance with the substrate.

As an example, when a via having a circular cross section with a diameter of 20 µm passes through a silicon substrate that is interposed between dielectric films having a thickness of 250 nm, the thickness of the substrate will be 50 µm, i.e., the length of the via will be 50 µm, and the capacitance will reach 0.45 pF. In-plane interconnections that are normally used have a capacitance on the order of 0.2 pF per 1 mm, and this via capacitance is therefore equivalent to approximately 2 mm of in-plane interconnections. Thus, when a multiplicity of interchip interconnections are used to transfer data between chips, the interconnection capacitance will not be small despite the reduction in the total interconnection length. In particular, in the case of a memory cell array chip with a configuration in which one chip has a plurality of banks, interchip interconnections must be provided for the number of banks for each one-bit DQ line. This increase in interconnection capacitance raises the problem of increased power consumption of the memory device.

SUMMARY OF THE INVENTION

The present invention was achieved in view of the above-described problems of the prior art and has as an object the provision of a three-dimensional semiconductor memory device that allows a reduction of the interconnection capacitance that is necessary for charging and discharging when transferring data between chips and that thus reduces power consumption of the memory device.

The stacked semiconductor memory device of the present invention includes:

a memory cell array chip that is stacked on a first semiconductor chip and in which sub-banks into which a bank memory is divided are organized and arranged according to input/output bits; and interchip interconnections for connecting the memory cell array chip with the first semiconductor chip and that are provided for the number of the input/output bits, and that pass through the memory cell array chip in the direction of stacking.

A stacked semiconductor memory device according to another aspect of the present invention includes:

a plurality of memory cell array chips that are stacked on a first semiconductor chip and in which sub-banks into which bank memories are divided are organized and arranged according to input/output bits; and interchip interconnections that are provided for the number of the input/output bits for connecting the sub-banks such that the corresponding input/output bits are the same, and that pass through the memory cell array chips in the direction of stacking of the memory cell array chips.

In this case, the sub-banks may be the divisions of a plurality of bank memories, and the bank memory configuration of each memory cell array chip may be the same.

Alternatively, the sub-banks may be the divisions of a plurality of bank memories, and the bank memory configuration of each memory cell array chip may differ.

The sub-banks may be the divisions of a single bank memory, and the bank memory configuration of each memory cell array chip may be the same.

Alternatively, the sub-banks may be the division of a single bank memory, and the bank memory configuration of each memory cell array chip may differ.

In addition, each memory cell array chip may be provided with an insulation means for electrically isolating the memory cell array chip from the interchip interconnections.

In addition, the interchip interconnections may be used for transferring data, and the stacked semiconductor memory device according to the present invention may further include a control means for controlling the insulation means such that, during the process of transferring data in any of the memory cell array chips, the other memory cell array chips are electrically isolated from the interchip interconnections.

In any of the above-described configurations, the first semiconductor chip may be an interface chip having an interface circuit with the outside.

In addition, the first semiconductor chip may be a processor chip having a microprocessor circuit.

In addition, the memory cell array may be a DRAM.

According to the present invention, in a three-dimensional semiconductor memory device in which memory cell array chips are stacked, the banks of a memory cell array may be divided sub-banks equal in number to the number of input/output bits and organized and arranged for each input/output bit. Connecting DQ lines from the sub-banks t to interchip interconnections for each input/output bit minimizes both the length of chip in-plane DQ lines and the number of interchip interconnections, whereby the interconnection capacitance can be reduced and the power consumption of the three-dimensional semiconductor memory device can be decreased.

BRIEF DESCRIPTION OF THE DRAWINGS

FIG. 5 shows (in the upper portion) the number of sub-banks and (in the lower portion) the sub-bank capacitance that correspond to the configuration of the number of bits and number of banks when the working example shown in FIG. 4 is applied to 512-Mb DRAM;

DETAILED DESCRIPTION OF THE PREFERRED EMBODIMENTS

The following explanation regards the details of a working example of the present invention with reference to the accompanying figures.

Figure 1:
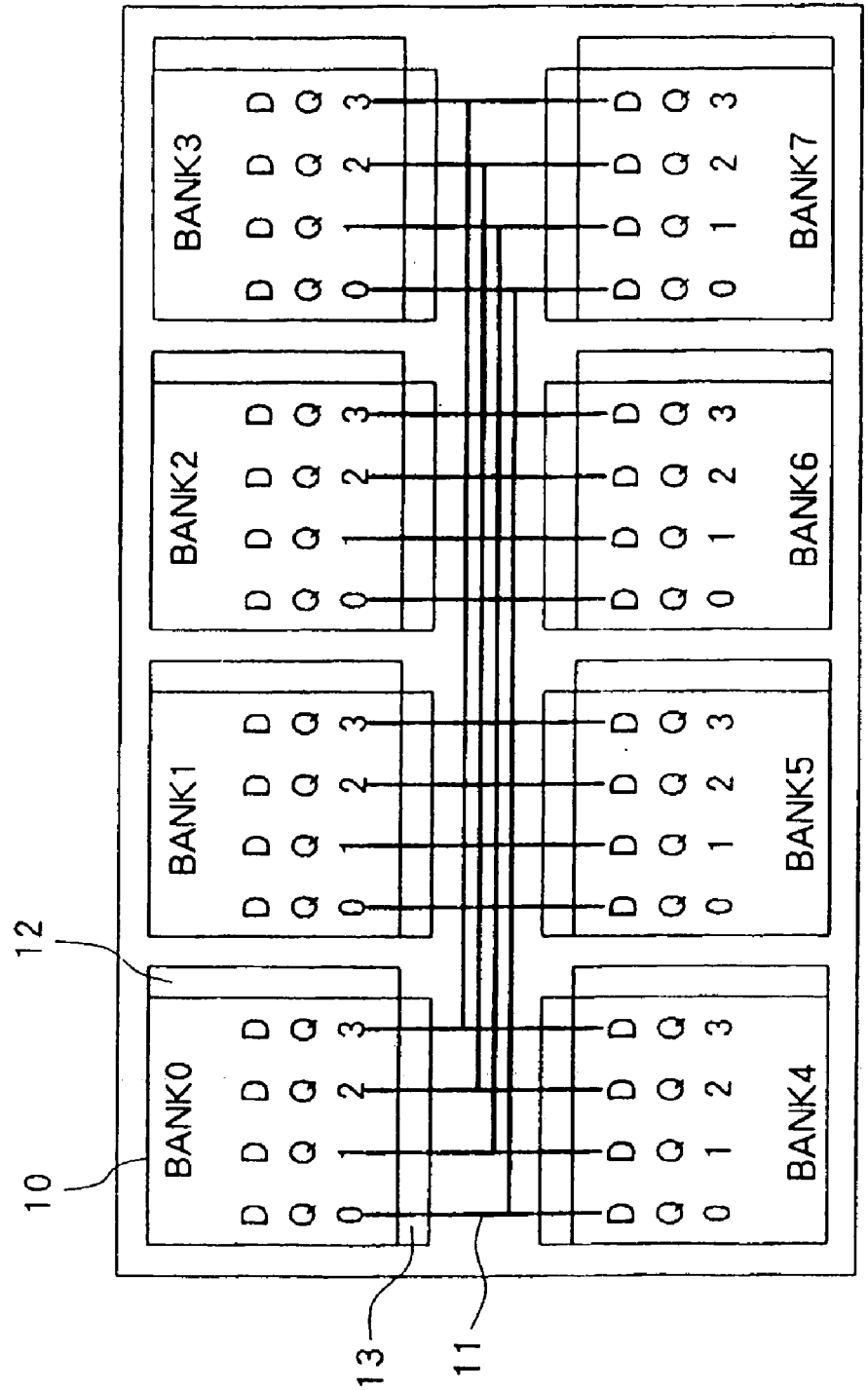
FIG. 1 shows the configuration of a memory cell array chip of an example of the prior art.
Figure 2:
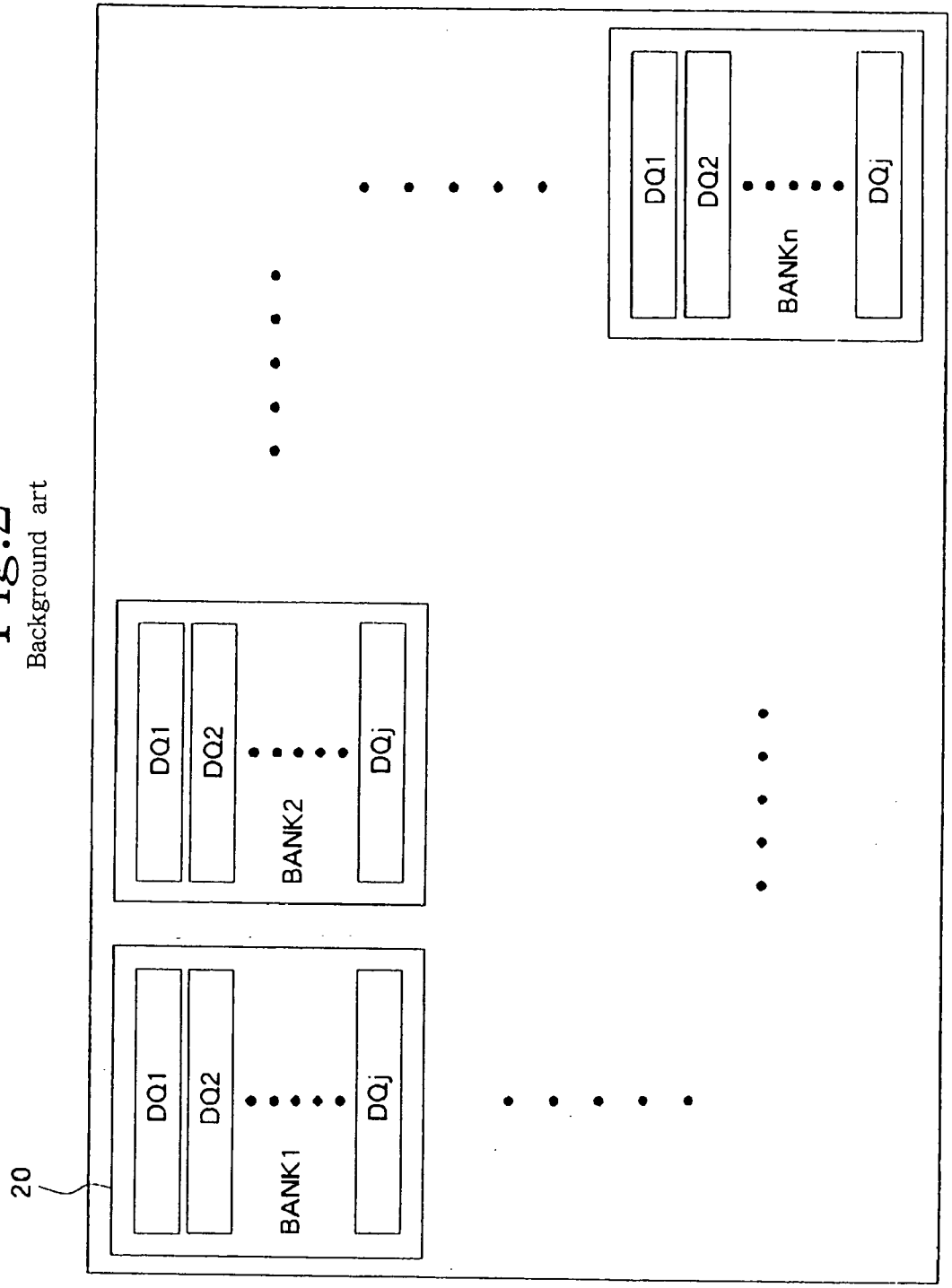
FIG. 2 shows the configuration of a memory cell array of an example of the prior art.
Figure 3:
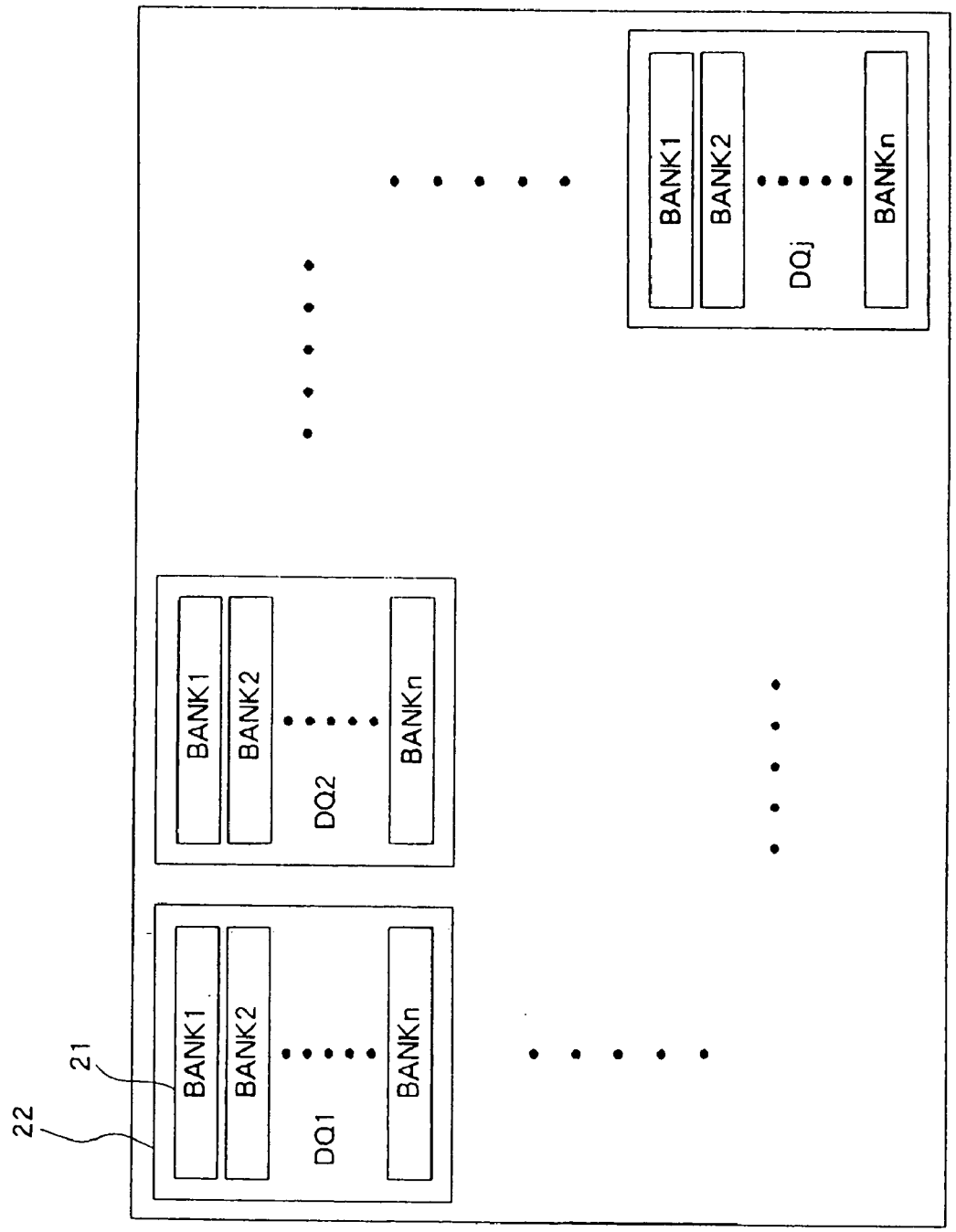
FIG. 3 shows the configuration of a memory cell array of the present invention.

Explanation first regards the constituent elements of the present invention with reference to the plan view of FIG. 3.

In the present invention, banks are divided into a number of sub-banks equal to the number j of input/output bits, resulting in a total j×n of sub-banks 21, and the sub-banks are collectively arranged for each input/output bit. In memory region 22 in which sub-banks 21 are collected for one input/output bit, the DQ lines from the sub-banks within memory region 22 are collected and connected to interchip interconnections, and data are transferred for each bit.

In the present invention that is configured as described above, in-plane interconnections may be used to connect sub-banks within memory region 22 in which sub-banks 21 are arranged for each bit, thus enabling reduced chip in-plane interconnection length and lower chip in-plane interconnection capacitance. In addition, the interchip interconnections need be provided in a number equal only to the number j of input/output bits and need not be provided in a number equal to the number n of banks, whereby the interconnection capacitance of the interchip interconnections is also reduced. Thus, a three-dimensional memory device in which memory cell array chips are stacked, can suppress the power required for the charge and discharge of interconnections in the transfer of data between a memory cell and another chip.

WORKING EXAMPLE 1

Figure 4:
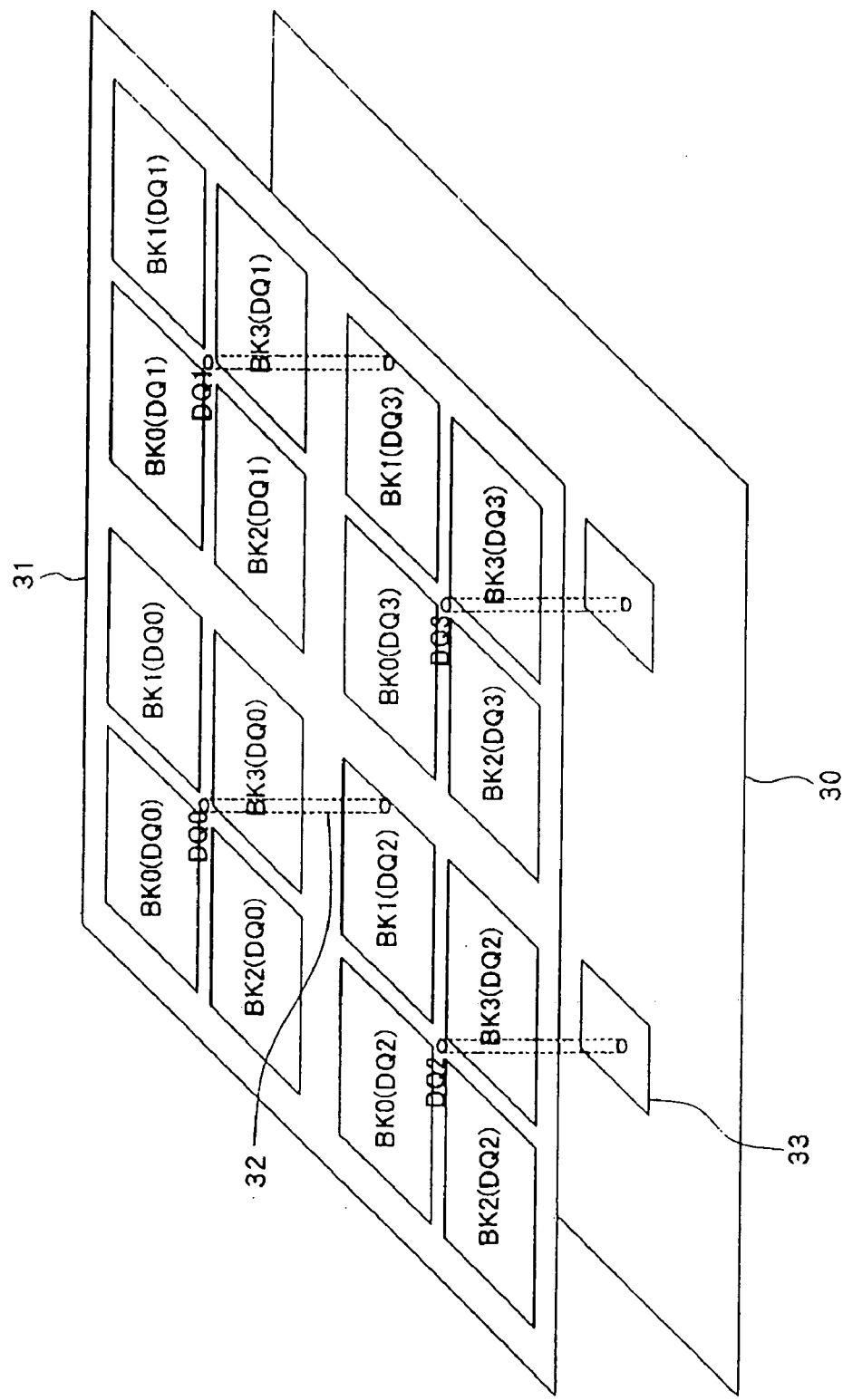
FIG. 4 shows the configuration of a first working example of the present invention.

FIG. 4 shows the configuration of the first working example of a stacked semiconductor memory device according to the present invention.

In the present working example, memory cell array chip 31, which is DRAM having a memory capacity of 512 Mb, is stacked on interface chip 30 on which integrated circuits are provided for interfacing with the outside. Memory cell array chip 31 has four input/output bits DQ0, DQ1, DQ2, and DQ3, and four banks BK0, BK1, BK2, and BK3.

Each bank is divided into four, which is the number of input/output bits. For example, bank BK0 is divided into the four sub-banks: BK0 (DQ0) that is composed of the memory cells of DQ0, BK0 (DQ1) that is composed of the memory cells of DQ1, BK0 (DQ2) that is composed of the memory cells of DQ2, and BK0 (DQ3) that is composed of the memory cells of DQ3. Banks BK1, BK2, and BK3 are similarly divided into the sub-banks BK1 (DQ0)-BK1 (DQ3), BK2 (DQ0)-BK2 (DQ3), and BK3 (DQ0)-BK3 (DQ3), respectively, resulting in a total of 16 sub-banks. Each of the sub-banks is provided with a column decoder and a row decoder for address signals (neither decoder is shown in the figures).

In memory cell array chip 31, the sub-banks are collectively arranged for each input/output bit. In the present working example, the number of input/output bits is four, and the surface of memory cell array chip 31 is therefore divided into four DQ regions, and the sub-banks of all of the banks are arranged in each DQ region. Each DQ region is composed of four sub-banks, and one interchip interconnection 32, which is a via, is provided in the center of each of the four sub-banks, the DQ lines of the four sub-banks being connected to this via. In this arrangement, interchip interconnections 32 are provided in the vicinity of all of the sub-banks, and almost no in-plane interconnection is required within the surface of memory cell array chip 31 for the DQ lines from the banks.

Memory cell array chip 31 and interface chip 30 are connected by four interchip interconnections in four DQ portions, and these serve as the data bus between the two chips. If the difficulty of sending different DQ data by a single interchip interconnection is taken into consideration, four interchip interconnections are the minimum number of interconnections that are needed in a four-input/output bit configuration. The interconnection capacitance is therefore low in both the interchip interconnections and within the in-plane interconnections, and therefore an increase in the power consumption of the DRAM can be reduced.

In the working example that is shown in FIG. 4, the memory configuration includes four input/output bits and four banks, but even if each of these numbers is increased, the interconnection capacitance can be suppressed and the power consumption reduced by dividing the banks into a number of sub-banks that is equal to the number of input/output bits and then collectively arranging the sub-banks for each input/output bit.

FIG. 5 shows the relation between the number of input/output bits and the number of banks with regard to the number of sub-banks and capacitance for DRAM having a capacity of 512 Mb.

WORKING EXAMPLE 2

Figure 6:
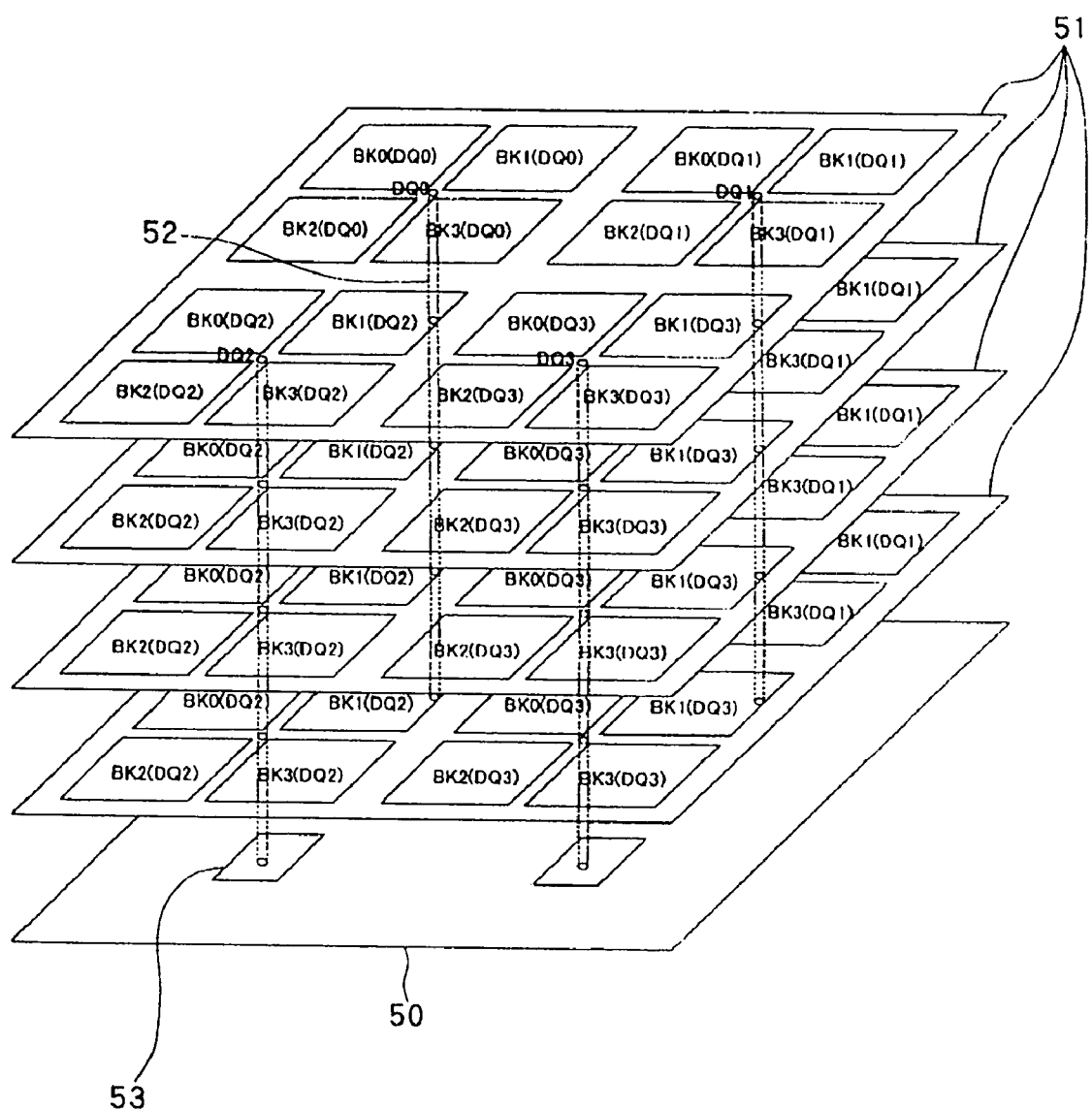
FIG. 6 shows the configuration of a second working example of the present invention.

The following explanation regards the second working example of the present invention with reference to FIG. 6. FIG. 6 shows the configuration of a three-dimensional semiconductor DRAM device. In the present working example, memory cell array chips 51 of DRAM having a memory capacity of 512 Mb are stacked on interface chip 50 in which interface circuits with the outside are integrated.

All of memory cell array chips 51 have the same configuration with four input/output bits DQ0, DQ1, DQ2, and DQ3, and four banks BK0, BK1, BK2, and BK3. Each bank is divided into four, which is the number of input/output bits. For example, bank BK0 is divided into the four sub-banks: BK0 (DQ0) that is composed of the memory cells of DQ0; BK0 (DQ1) that is composed of the memory cells of DQ1; BK0 (DQ2) that is composed of the memory cells of DQ2; and BK0 (DQ3) that is composed of the memory cells of DQ3. BK1 (DQ0)-BK1 (DQ3), BK2 (DQ0)-BK2 (DQ3), and BK3 (DQ0)-BK3 (DQ3) are similarly divided, resulting in a total of 16 sub-banks. Each of the sub-banks has a column decoder and a row decoder for address signals (neither decoder being shown in the figures).

The sub-bank arrangement is identical for all of memory cell array chips 51, and all of memory cell array chips 51 therefore can share interchip interconnections 52 that pass through these chips as DQ lines. Inter chip interconnections 52 connect with input/output buffer 53 that is provided on interface chip 50, and memory read and write operations are carried out using input/output buffer 53 and interchip interconnections 52. Even when four memory cell array chips 51 are stacked, data transfer can be carried out between all of the chips by four interchip interconnections, and even within the chip plane, almost no in-plane interconnection is required from the sub-banks to the interchip interconnections. As a result, power consumption due to interconnections can be suppressed to a low level.

In addition, while a particular memory cell array chip is being accessed, the other chips can be electrically isolated from the interchip interconnections that are being used as DQ lines. In such a case, a greater effect in reducing power can be obtained by providing components such as tristate buffers and transfer gate switches as insulation means between the interchip interconnections and the data amplifiers of DQ lines of the memory cell array on a memory cell array chip surface, by providing a control means somewhere in the device for implementing control such that a memory cell array chip is uniquely selected, and then by electrically isolating the interconnections, whereby the capacitance load of all of the circuits that are connected to the DQ lines of that chip is prevented from reaching the interchip interconnections.

In the present working example, the arrangement of all sub-banks is the same in chips that are stacked above and below as shown in FIG. 6, but for the purpose of sharing DQ lines, the actual arrangement of sub-banks that are collected within the DQ regions is in fact free as long as the regions in which sub-banks of the same DQ are collected are arranged in the same positions vertically. In addition, the number of stacked memory cell array chips may be further increased to increase the capacity of the memory device.

WORKING EXAMPLE 3

Figure 7:
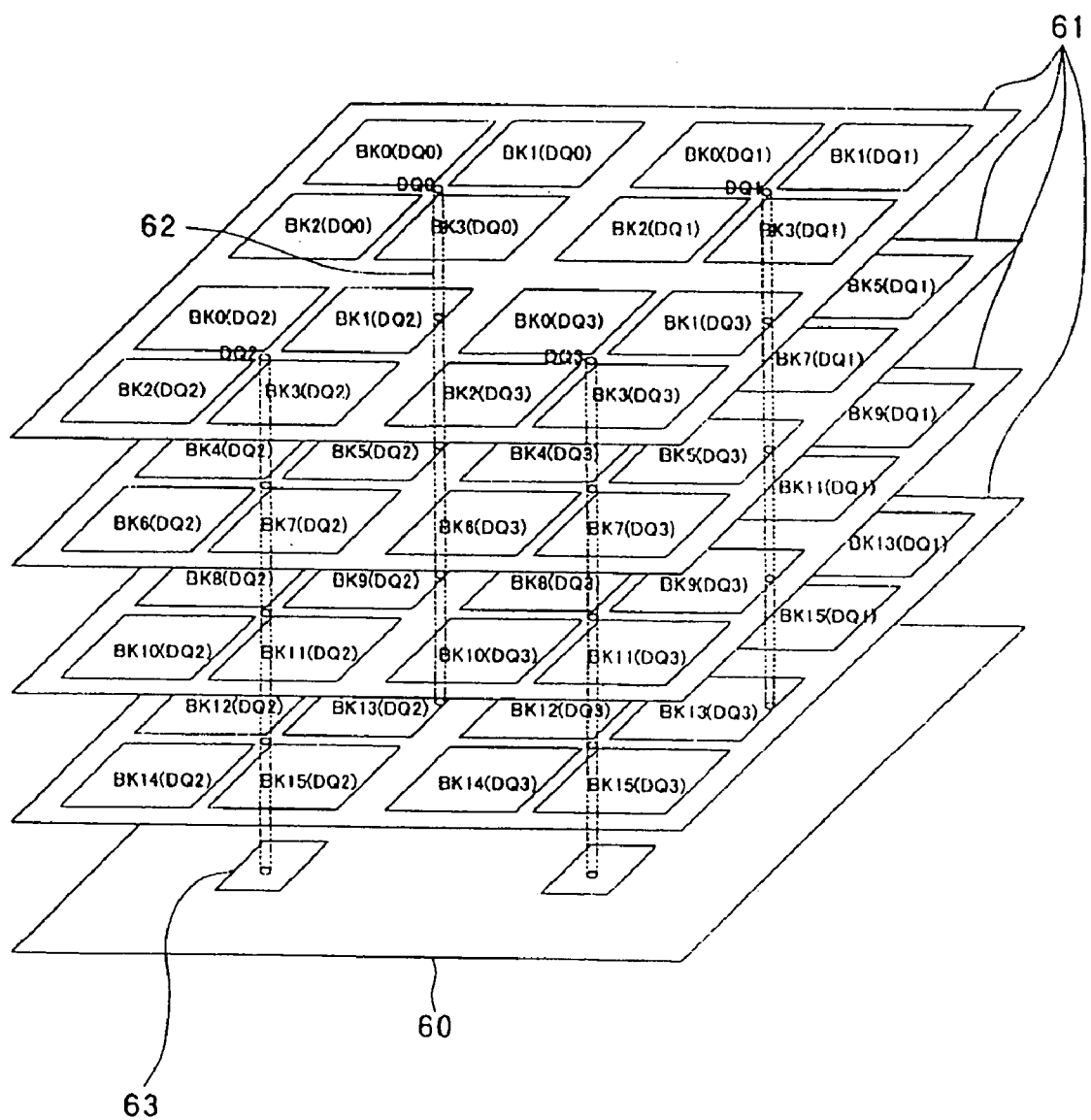
FIG. 7 shows the configuration of a third working example of the present invention.

The following explanation regards the third working example of the present invention with reference to FIG. 7. FIG. 7 shows the configuration of a three-dimensional semiconductor DRAM device, which is the third working example of the present invention. In the present working example, four memory cell array chips 61 that are DRAM having a memory capacity of 512 Mb are stacked on interface chip 60, on which interface circuits that connect with the outside are integrated. Memory cell array chips 61 are composed of memory cell arrays having four input/output bits and four banks.

Although all memory cell array chips 51 have the same memory configuration in the second working example, in the present working example, the chips have four different banks on each chip. In other words, the memory configuration of the four stacked DRAM devices includes four input/output bits DQ0, DQ1, DQ2, and DQ3, and 16 banks from BK0–BK15. Each bank is then divided into four parts, which is the number of input/output bits, whereby the number of sub-banks is 64. Each of the sub-banks has a column decoder and row decoder for address signals (neither decoder being shown in the figures).

All of memory cell array chips 61 share a single interchip interconnection 62 with respect to the same direction of stacking as the DQ line, and the sub-banks are therefore collectively arranged for each DQ in each memory cell array chip 61, and moreover, the DQ region of each memory cell array chip 61 is arranged at the same position in the direction of stacking. Inter chip interconnections 62 are connected to input/output buffer 63 that is provided on interface chip 60, and memory read and write operations are carried out using input/output buffer 63 and interchip interconnections 62.

The bank configuration of the same DQ regions differs between upper and lower chips, and for the purpose of interleaving memory access between banks, while data are being transferred to the memory of particular memory cell array chips 61, the sub-banks of other chips are placed in an electrically isolated state from interchip interconnections 62 that are the DQ lines. In particular, a greater effect in reducing power can be obtained by providing components such as tristate buffers and transfer gate switches as insulation means between the interchip interconnections 62 and the data amplifiers of the DQ lines of the memory cell array on the surface of each memory cell array chip 61, by providing a control means somewhere in the device for implementing control such that memory cell array chips are uniquely selected, and then by electrically isolating the interconnections, whereby the capacitance load of all of the circuits that are connected to the DQ lines of memory cell array chip 61 is prevented from reaching the interchip interconnections 62.

As described in the foregoing explanation, by collectively arranging the sub-banks for each DQ in the present working example, all interchip data transfer can be realized by interchip interconnections of the DQ types, regardless of the number of memory cell array chips. For example, even if eight stacked memory cell array chips have different bank configurations, data transfer between all of the chips can be realized by four interchip interconnections, and further, almost no in-plane interconnections are required from sub-banks to the interchip interconnections within the chip planes, whereby power consumption due to interconnections can be reduced to a low level.

WORKING EXAMPLE 4

Figure 8:
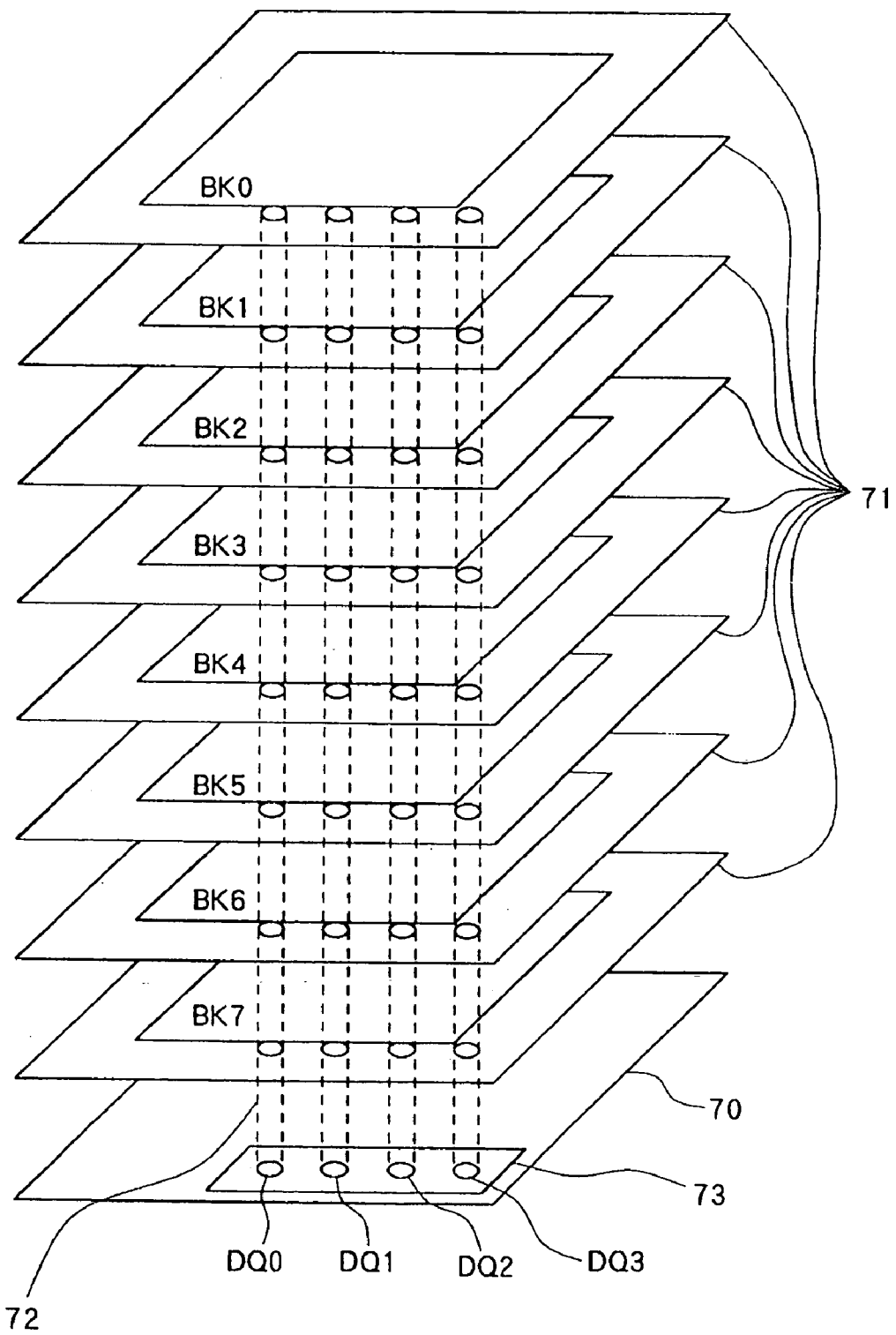
FIG. 8 shows the configuration of a fourth working example of the present invention.

The following explanation regards the fourth working example of the present invention with reference to FIG. 8. FIG.8 shows the configuration of a three-dimensional semi-conductor DRAM device that is the fourth working example of the present invention.

In the present working example, eight DRAM memory cell array chips 71 each having a memory capacity of 128 Mb are stacked on an interface chip 70 in which interface circuits that connect with the outside are integrated. Each of the memory cell arrays that make up the memory cell array chips 71 has four input/output bits.

In the first to third working examples, the memory cell arrays are configured from a plurality of banks within a memory cell array chip, but in the present working example, the memory cell arrays have a single-bank configuration. In other words, the eight DRAM devices have a four-bit memory configuration of input/output bits DQ0, DQ1, DQ2, and DQ3, and eight banks from BK0 to BK7. The plurality of memory cell array chips may also have a single-bank configuration. Each of the banks has a column decoder and a row decoder for address signals (neither decoder being shown in the figures). All memory cell array chips 71 share one interchip interconnection 72 as a DQ line for each input/output bit with relation to the direction of stacking. Inter chip interconnection 72 is connected to input/output buffer 73 that is provided on interface chip 70, and memory read and write operations are carried out using input/output buffer 73 and interchip interconnection 72.

Compared to a case having a configuration with a plurality of banks within the plane of a memory cell array chip, as in the first to third working examples, a case in which a plurality of banks is realized by stacking chips as in the present working example is advantageous in that the need is eliminated for in-plane interconnections for DQ lines between banks as shown in FIG. 3, and further, the number of banks can be increased by stacking chips without increasing the number of interchip interconnections, which is the number of input/output bits. However, in order to interleave memory access between banks, while transferring data to the memory of the bank of a particular memory cell array chip, the memory of the banks of other memory cell array chips must be electrically isolated from the interchip interconnections, which are the DQ lines.

A greater effect in reducing power can be obtained by providing components such as tristate buffers and transfer gate switches as insulation means between the interchip interconnections 72 and the data amplifiers of DQ lines of the memory cell array on the surface of memory cell array chips 71, by providing a control means somewhere in the device for implementing control such that a memory cell array chip is uniquely selected, and then by electrically isolating the interconnections, whereby the capacitance load of all of the circuits that are connected to the DQ lines of each memory cell array chip 71 is prevented from reaching the interchip interconnections.

Although the memory was DRAM in each of the working examples that have been described above, a similar configuration can be realized using SRAM. In addition, although a memory cell array chip was stacked on an interface chip and data transfer carried out between chips in each of the working examples, a memory cell array chip having the same sub-bank configuration as each working example may be stacked on a semiconductor chip in which microprocessors are integrated and data transfer then carried out between memories of the sub-banks and the processors for each DQ. Further, memory cell arrays may be integrated on semiconductor chips in which interface circuits or microprocessor circuits have been integrated and data transfer then carried out between memory cell arrays that are between chips.

What is claimed is:

1. A stacked semiconductor memory device, comprising:
   a memory cell array chip that is stacked on a first semiconductor chip and in which sub-banks into which a bank memory is divided are organized and arranged according to input/output bits; and
   interchip interconnections for connecting said memory cell array chip to said first semiconductor chip and that are provided for the number of said input/output bits and that pass through said memory cell array chip in the direction of stacking.

2. The stacked semiconductor memory device according to claim 1, wherein said first semiconductor chip is an interface chip having an interface circuit that connect with the outside.

3. The stacked semiconductor memory device according to claim 1, wherein said first semiconductor chip is a processor chip having a microprocessor circuit.

4. The stacked semiconductor memory device according to claim 1, wherein said memory cell array is DRAM.

5. A stacked semiconductor memory device, comprising:
a plurality of memory cell array chips that are stacked on a first semiconductor chip and in which sub-banks into which a bank memory is divided are organized and arranged according to input/output bits; and
interchip interconnections that are provided for the number of said input/output bits for connecting said memory cell array chips such that the corresponding input/output bits of said sub-banks are the same, and that pass through the memory cell array chips in the direction of stacking of said memory cell array chips.

6. The stacked semiconductor memory device according to claim 5, wherein said sub-banks are the divisions of a plurality of bank memories, the bank memory configuration of each memory cell array chip being the same.

7. The stacked semiconductor memory device according to claim 5, wherein said sub-banks are the divisions of a plurality of bank memories, the bank memory configuration of each memory cell array chip being different.

8. The stacked semiconductor memory device according to claim 5, wherein said sub-banks are the divisions of a single bank memory, the bank memory configuration of each memory cell array chip being the same.

9. The stacked semiconductor memory device according to claim 5, wherein said sub-banks are the divisions of a single bank memory, the bank memory configuration of each memory cell array chip being different.

10. The stacked semiconductor memory device according to claim 5, wherein each memory cell array chip is provided with an insulation means for electrically isolating said memory cell array chip from said interchip interconnections.

11. The stacked semiconductor memory device according to claim 10, wherein:
said interchip interconnections are used for transferring data, and
said stacked semiconductor memory device further comprises a control means for controlling said insulation means such that, during the process of transferring data in any of the memory cell array chips, the other memory cell array chips are electrically isolated from said interchip interconnections.

12. The stacked semiconductor memory device according to claim 5, wherein said first semiconductor chip is an interface chip having an interface circuit that connect with the outside.

13. The stacked semiconductor memory device according to claim 5, wherein said first semiconductor chip is a processor chip having a microprocessor circuit.

14. The stacked semiconductor memory device according to claim 5, wherein said memory cell array is DRAM.

* * * * *